United States Patent [19]

Shu et al.

[11] Patent Number: 4,670,861

[45] Date of Patent: Jun. 2, 1987

[54] CMOS N-WELL BIAS GENERATOR AND GATING SYSTEM

[75] Inventors: Lee-Lean Shu, Milpitas; Chao-Ven Kao, Santa Clara; Tai C. Shyu, San Jose, all of Calif.

[73] Assignee: Advanced Micro Devices, Inc., Sunnyvale, Calif.

[21] Appl. No.: 747,520

[22] Filed: Jun. 21, 1985

[51] Int. Cl.$^4$ .................. G11C 7/00; G11C 13/00
[52] U.S. Cl. .................. 365/181; 365/182; 365/226
[58] Field of Search .......... 365/182, 189, 203, 226, 365/181; 307/296 R

[56] References Cited

U.S. PATENT DOCUMENTS

| | | | |
|---|---|---|---|
| 4,233,672 | 11/1980 | Suzuke | 365/226 X |
| 4,356,412 | 10/1982 | Moench et al. | 307/304 |
| 4,472,792 | 9/1984 | Shimohigashi et al. | 365/189 |
| 4,532,439 | 7/1985 | Koike | 365/182 X |

OTHER PUBLICATIONS

An N-Well CMOS Dynamic RAM by Shimohigashi et al, IEEE Journal of Solid State Circuits, vol. SC-17, No. 2, Apr. 1982.

An 8K×8 Bit Static MOS RAM Fabricated by nMOS/nWell CMOS Technology by Ohzone et al. IEEE Journal Solid State Ccts., vol. SC-15, No. 5, Oct./80.

1983 IEEE Intnl. Solid State Circuits Conference, Session 6, A 70ns High Density CMOS-DRAM.

Primary Examiner—Stuart N. Hecker
Assistant Examiner—Alyssa H. Bowler
Attorney, Agent, or Firm—Patrick T. King

[57] ABSTRACT

A system for preventing forward biasing of the bit line junctions formed between the N-well and bit lines of a CMOS memory. The system includes a gating system for maintaining the bit line voltage at $V_{CC}/2$ whenever the well voltage is less than $V_{CC}$. A well regulator and well pump maintain the well voltage at a selected multiple of $V_{CC}$.

11 Claims, 8 Drawing Figures

CMOS N-WELL BIAS GENERATOR AND GATING SYSTEM

BACKGROUND OF THE INVENTION

The invention relates generally to biasing a region in a semiconductor integrated circuit to a selected voltage level and, more particularly, to a system for preventing undesired charge injection for bipolar latchup in a CMOS integrated circuit.

Recent advances in CMOS technology have allowed memory circuit designers to realize the power reduction inherent in CMOS design while achieving high density. However, as memory cell size decreases to allow for high density arrays, the susceptibility of alpha particle induced soft errors in the array increases. A CMOS DRAM utilizing PMOS memory cells disposed in an N-well formed in P substrate significantly reduces this soft error susceptibility.

The N-well must be biased to a higher voltage level than the PMOS transfer gates in the memory cells and the P channel bit line connections to reverse bias the semiconductor junctions formed between these PMOS elements and the N-well. If these junctions are forward biased, then undesired charge injection takes place between the PMOS memory cells and the bit line connections in the N-well, thereby destroying the information stored in the memory. Additionally, the various P type and N type regions in a CMOS array form bipolar transistors. If the above-described junctions are forward biased then the transistors may form a feedback current loop to allow high substrate current. This phenomenon is termed bipolar latch up.

The active cycle of the memory is initiated by clocking a control signal received at a control input of the memory. During the active cycle, selected word lines are clocked to couple selected storage cells to the bit lines. The voltage level on half the bit lines in the array are pulled to the power supply level, $V_{CC}$, by the sense amps.

The N-well may be biased to a multiple of $V_{CC}$, e.g., 1.5 $V_{CC}$, to prevent forward biasing during the active cycle. A CMOS memory having an N-well biased at 1.5 $V_{CC}$ is described in an article by Shimohigashi, et al. entitled "An N-Well CMOS Dynamic RAM," IEEE Journal of Solid State Circuits, Vol. SC-17, No. 2, April, 1982, pp. 344–348.

However, during initial power-up, or during an excursion in the value of the power supply voltage ($V_{CC}$ bump), the bit line voltage may exceed the N-well bias voltage and forward bias the semiconductor junction. The large capacitance of the N-well causes the rate of change of the N-well bias voltage level to be slower than the rate of change of the bit line voltage level. Thus, the bit line voltage may exceed the N-well voltage for a short time. During this time the above-described problems of charge injection and bipolar latchup will be present if the memory is in the active cycle.

Accordingly, a system for preventing the forward biasing of the junctions between the bit lines and the N-well during the active cycle of the memory is greatly needed in the industry. This system must protect the memory during initial power-up and during a $V_{CC}$ bump. Additionally, the system must consume low power so as not to degrade the low power dissipation inherent in CMOS technology.

SUMMARY OF THE INVENTION

The present invention is a system for preventing forward biasing of the bit line junctions and memory cell junctions formed between the N-well and bit line terminals and memory cells, respectively. The system is for use with a memory array where the bit lines are precharged to a fraction of $V_{CC}$, e.g., $V_{CC}/2$.

The invention includes a gating system for forcing the array into precharge during a critical time period when $V_W$ is less than $V_{CC}$. The gating system overrides the external control signal during the critical period. Thus, the bit line is held at $V_{CC}/2$ until $V_W$ is greater than $V_{CC}$.

According to a further aspect of the invention, a well regulator and charge pump maintain $V_W$ at a multiple of $V_{CC}$, e.g., 1.5 $V_{CC}$. However, during initial powerup or a $V_{CC}$ bump $V_W$ rises more slowly than $V_{CC}$ because of the large capacitance of the well. Accordingly, $V_W$ will be less than $V_{CC}$ during a critical time period.

If the array were driven into the active cycle during this critical time period, then half the bit lines would be pulled to $V_{CC}$. Because $V_W$ is less than $V_{CC}$, the junctions between these bit lines and the N-well would be forward biased, thereby causing charge injection and bipolar latchup.

The gating system prevents forward biasing during the critical period by holding the array in precharge to maintain the bit line voltage at $V_{CC}/2$. Once $V_W$ is greater than $V_{CC}$ the gating system releases the array to the control of the external control signal.

In a preferred embodiment, the gate control signal is clocked by a CMOS differential amplifier having its inverting input coupled to $V_{CC}$ and its non-inverting input coupled to $V_W$.

According to a further aspect of the invention, a well enabling circuit clocks a well enabling signal to disable the differential amplifier when $V_W$ is greater than $V_{CC}+V_T$, where $V_T$ is the threshold of a MOS transistor.

According to a further aspect of the invention, a holding transistor holds the gate control signal at $V_{CC}$ when the well detector is disabled.

The differential amplifier consumes power when in operation. By disabling the differential amplifier subsequent to termination of the critical time period, power dissipation of the system is reduced.

Other aspects and advantages will become apparent by reference to the drawings and the detailed description which follow.

DETAILED DESCRIPTION OF THE PREFERRED EMBODIMENTS

The present invention is a system for preventing charge injection from the bit lines to the N-well and for preventing bipolar latchup during the active cycle of a CMOS memory array. The system is for use in a memory scheme where the bit lines are biased to $V_{CC}/2$ during the precharge cycle of the memory. A biasing system suitable for use with the present invention is disclosed in the copending, commonly assigned, patent application entitled "CMOS DRAM MEMORY ARRAY BIAS SCHEME," by Chuang, et al. There, an externally clocked signal, $\overline{RAS}$, is received at the control input of the memory. When $\overline{RAS}$ is high the chip is in the precharge state and the bit lines are coupled to each other and to a $V_{CC}/2$ bias voltage generator. When $\overline{RAS}$ is clocked low, bit lines are isolated from each other and from the $V_{CC}/2$ bias voltage generator.

During the active cycle, half of the bit lines in the array are pulled to $V_{CC}$ and half are pulled to ground by the sense amplifiers. When $\overline{RAS}$ is clocked high again, the bit lines are again coupled to each other and to the $V_{CC}/2$ bias voltage generator to rapidly return the bit lines to $V_{CC}/2$.

In the description that follows, various control signals are switched between low and high voltage states in response to specified circuit conditions. Generally, the magnitude of the high voltage state is equal to about $V_{CC}$ and the magnitude of the low voltage state is equal to about ground.

The operation of the circuit will be generally described with reference to FIGS. 1-3, which are a block diagram and timing diagrams, respectively. Specific circuitry for implementing the functions described in the block diagram will be presented with reference to FIGS. 4, 5, and 6.

Figure 1:
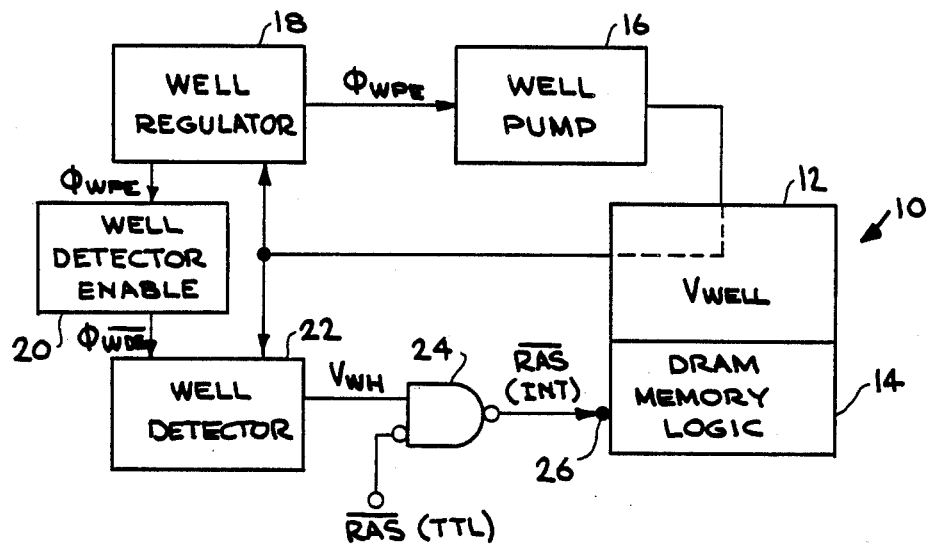
FIG. 1 is a block diagram of an embodiment of the invention.

Referring now to FIG. 1, the memory array 10 includes an N-well 12 and DRAM memory logic circuitry 14. The N-well is coupled to the output of a well pump 16. The well pump has an input for receiving a well pump enable signal $\phi_{WPE}$, clocked by a well regulator 18.

The well regulator 18 has an input coupled to the N-well for monitoring the N-well bias level, $V_W$. The well pump enable signal $\phi_{WPE}$, is directed to the input of a well detector enable circuit 20.

A well detector enable circuit 20 clocks a well detector enable signal, $\phi_{WDE}$. The well detector enable circuit includes a first input coupled to $\phi_{WPE}$ and a second input coupled to $V_W$.

This well detector enable signal, $\phi_{WDE}$, is directed to a first input of a well detector circuit 22. A second input of the well detector circuit 22 is coupled to the N-well 12 and monitors $V_W$. The well detector 22 clocks a gate control signal, $V_{WH}$.

A NAND gate 24 receives the gate control signal, $V_{WH}$, at a first input and receives the external control signal, $\overline{RAS}$ at a second inverting input. The NAND gate 24 clocks the internal control signal, $\overline{RAS}$ (INT), which is coupled to the control input 26 of the DRAM memory logic circuitry 14.

The operation of the circuit depicted in FIG. 1 will now be described with reference to FIG. 2. FIG. 2 is a timing diagram depicting the voltage levels, $V_{CC}$ and $V_W$, as a function of time. Additionally, the states of the gate control signal, $V_{WH}$, the internal control signal, $\overline{RAS}$, the well detector enable signal, $\phi_{WDE}$, and the well pump enable signal, $\phi_{WPE}$ are depicted.

Figure 2:
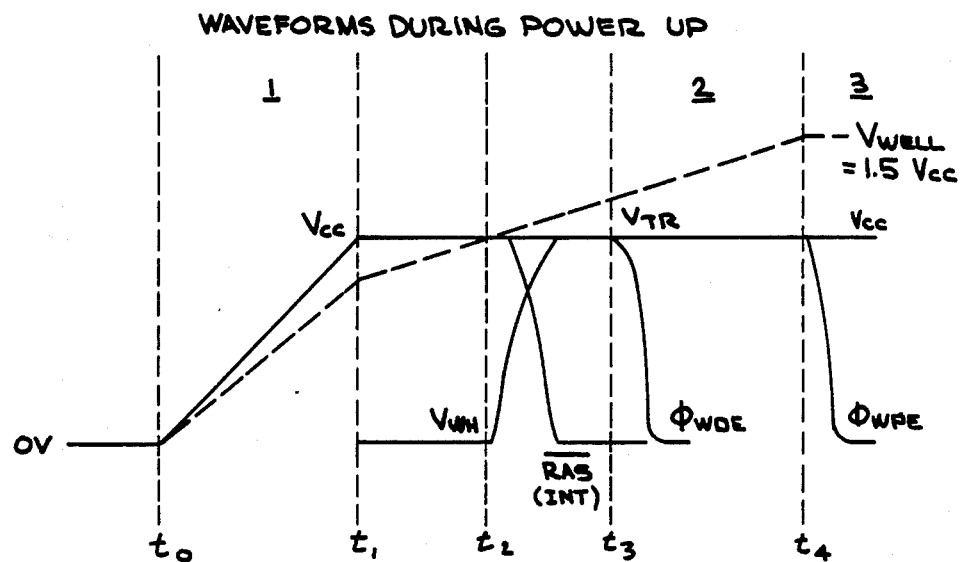
FIG. 2 is a timing diagram indicating the state of the various control signals and voltage levels during the powerup phase of memory operation.

Referring now to FIG. 2, at time $T_0$ the external power supply is turned on and the external power supply voltage level begins to increase. At time $T_1$ the external voltage supply level is equal to the full value $V_{CC}$. Note that the bias voltage level of the N-well 12 increases more slowly than the external power supply voltage. The well regulator clocks $\phi_{WPE}$ high whenever V well is less than a reference voltage equal to 1.5 $V_{CC}$. When $\phi_{WPE}$ is clocked high the well pump is enabled and transfers charge to the N-well to increase the bias voltage level, $V_W$, of the well. The quantity $V_W$ increases more slowly than the external power supply voltage level because the capacitance of the N-well is high and a substantial amount of charge must be pumped in the N-well to increase $V_W$ to 1.5 $V_{CC}$.

At time $T_4$, $V_W$ is equal to 1.5 $V_{CC}$ and $\phi_{WPE}$ is clocked low by the voltage regulator 18. If V well is above 1.5 $V_{CC}$ then charge will be transferred from the well to the ground tunnel of the external power supply via the well regulator 18. Note that the well regulator 18, well pump 16, and N-well 12 are coupled to form a feedback loop to maintain the value of $V_W$ at 1.5 $V_{CC}$.

The well detector enable circuit 20 clocks $\phi_{WDE}$ high when $\phi_{WPE}$ is high and $V_W$ is less than $V_{CC}+V_T$, where $V_T$ is the threshold voltage of a PMOS transistor. When $\phi_{WDE}$ is clocked high, the well detector circuit 22 is enabled. The signal $\phi_{WDE}$ is clocked low when $V_W$ is greater than $V_{CC}+V_T$. The well detector 22 is disabled when $\phi_{WDE}$ is clocked low. In FIG. 2 $\phi_{WDE}$ is clocked low at time $T_3$.

The well detector 22 clocks $V_{WH}$ to the low voltage state when $V_W$ is less than $V_{CC}$ and clocks $V_{WH}$ to the high voltage state at time $T_2$ when $V_W$ is greater than $V_{CC}$.

The function of the gate control signal, $V_{WH}$, will now be described. Table 1 is a truth table for the NAND gate 24 with the inverting input. When $V_{WH}$ is low the external control signal, $\overline{RAS}$ (INT), is high regardless of the state of the external control signal, $\overline{RAS}$. Thus, when $V_W$ is less than $V_{CC}$, $\overline{RAS}$ (INT) is always in the high voltage state and the chip is always in the precharge state. As described above, during the precharge state the bit lines are biased to $V_{CC}/2$.

TABLE 1

| $V_{WH}$ | RAS | $\overline{RAS}(INT)$ |
|---|---|---|
| L | H | H |
| L | L | H |
| H | H | H |
| H | L | L |

If the external control signal, $\overline{RAS}$, were directly connected to the memory array control input 26, then the active state of the memory array 10 could be initiated during the period $T_0$ to $T_2$. If the active state were initiated during this time, the sense amps would pull half of the bit lines to $V_{CC}$ and the junction between those bit lines and the N-well would be forward biased, thereby inducing charge injection and bipolar latchup. Thus, when $V_W$ is less than the gate 24 prevents the external control signal, $\overline{RAS}$, from affecting the value of $\overline{RAS}$ (INT) received at the control input 26. The voltage levels on the bit lines are maintained at $V_{CC}/2$.

When the well bias level, $V_W$, increases to $V_{CC}$, then $V_{WH}$ is clocked low to release the chip from the well detector 22 and make the gate 24 transparent to the $\overline{RAS}$ signal. Referring back to Table 1, when $V_{WH}$ is high, $\overline{RAS}$ (INT) is equal to $\overline{RAS}$.

As will be described more fully below, the well detector is a CMOS differential amplifier with the inverting input coupled to $V_{CC}$ and the non-inverting input coupled to $V_W$. This amplifier draws current and dissipates power. The well detector 22 performs no useful function once $V_W$ is greater than $V_{CC}$. Accordingly, the well detector enable circuit 20 clocks $\phi_{WPE}$ low at time $T_2$ when $V_W$ is equal to about $V_{CC}+V_T$. Thus the power dissipation of the system is minimized to preserve the inherent low power features of CMOS technology.

The functioning of the system during a $V_{CC}$ bump will now be described with reference to the timing diagram of FIG. 3. In FIG. 3, $V_{CC}$ bumps from four volts to seven volt between time $X_1$ and time $X_4$.

At time $X_1$, $V_W$ is equal to 1.5 $V_{CC}$, $V_{WH}$ is low, the NAND gate 24 is transparent, and the state of $\overline{RAS}$ (INT) is equal to the state of $\overline{RAS}$. Thus, the chip is under the control of the external control signal, $\overline{RAS}$. At time $X_2$, $\phi_{WPE}$ is clocked high because $V_W$ is less than 1.5 $V_{CC}$. Clocking $\phi_{WPE}$ high enables the well pump 16. The well pump 16 begins transferring charge to the N-well to increase $V_W$. As described above, the rate of increase of $V_W$ is less than the rate of increase of $V_{CC}$ due to N-well capacitance.

At time $X_3$, $V_{CC}$ is greater than $V_W$, and $V_{WH}$ is clocked low to set $\overline{RAS}$ (INT) high and force the chip into the precharge state. At this point, the external control signal, $\overline{RAS}$, has no effect on the state of the memory array.

The magnitude of $V_W$ continues to increase due to the action of the charge pump and, at time $X_5$, $V_W$ is equal to $V_{CC}$ and the well detector clock $V_{WH}$ high to release the chip and restore control of the chip to the external control signal, $\overline{RAS}$.

At time $X_6$, the well detector enable circuit clocks $\phi_{WDE}$ low to disable the well detector and conserve power. At time $X_7$, $V_W$ is again equal to 1.5 $V_{CC}$ and $\phi_{WPE}$ is clocked low to disable the well pump 16.

Figure 4:
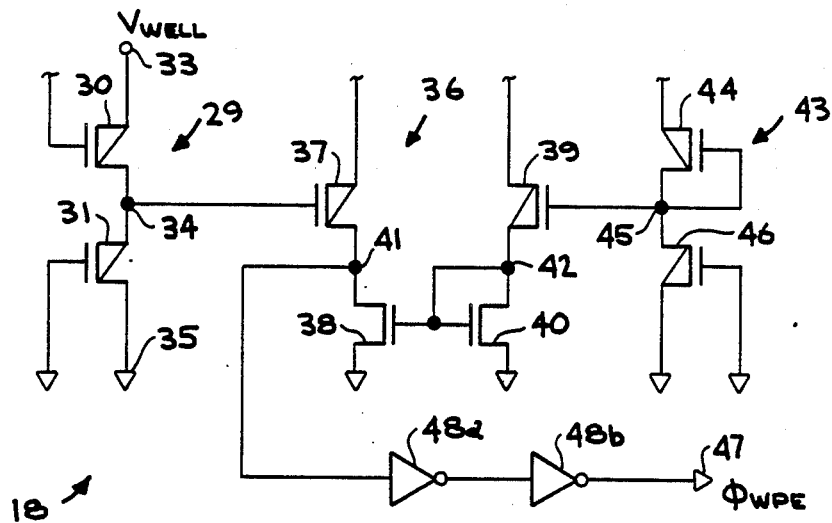
FIG. 4 is a circuit diagram of the well regulator.

FIG. 4 is a circuit diagram of the well regulator 18. The well regulator includes a biasing circuit 29 comprising first and second PMOS biasing transistors 30 and 31. The source terminal of the first biasing transistor 30 is coupled to a $V_W$ input 33, the gate is coupled to $V_{CC}$, and the drain terminal is coupled to a biasing node 34. The source terminal of the second biasing transistor 31 is coupled to the biasing node 34, the gate is coupled to ground, and the drain terminal is coupled to ground 35.

The CMOS comparator 36 is formed by a first series circuit including a first input transistor 37 and NMOS transistor 38, and by a second series circuit including second input transistor 39 and NMOS transistor 40. The first input transistor 37 has its source terminal coupled to $V_{CC}$, its gate coupled to the biasing node 34, and its drain terminal coupled to an output node 41. NMOS transistor 38 has its drain terminal coupled to output node 41 and its source terminal coupled to ground. The second input transistor 39 has its source terminal coupled to $V_{CC}$, and its drain terminal coupled to circuit node 42. The gates of NMOS transistors 38 and 40 are coupled to circuit node 42.

A reference circuit 43 includes PMOS transistor 44, having its source terminal coupled to $V_{CC}$ and its drain terminal and gate coupled to reference node 45 and PMOS transistor 46, having its source terminal coupled to reference node 45 and its drain terminal and gate coupled to ground.

The output node 41 is coupled to a $\phi_{WPE}$ terminal 47 by inverters 48a and b.

The operation of the circuit depicted in FIG. 4 will now be described. The (W/L) ratios of transistors 44 and 46 in the reference circuit 43 are equal so that the voltage level at the reference node 45 is $V_{CC}/2$. Accordingly, the input voltage, $V_2$, at the gate of the second input transistor 39 of the CMOS comparator 36 is set at $V_{CC}/2$.

The transistors 30 and 31 of the biasing circuit 29 each have the same (W/L) ratio. The voltage level at the biasing node 34 is greater than $V_{CC}/2$ if $V_{WELL}$ is greater than 1.5 $V_{CC}$ and less than $V_{CC}/2$, if $V_{WELL}$ is less than 1.5 $V_{CC}$. The input voltage, $V_1$, at the gate of the first transistor 37 of the CMOS comparator 36 is coupled to the biasing node. 34 Accordingly, $V_1$ is greater than $V_2$ if $V_{WELL}$ is greater than 1.5 $V_{CC}$ and $V_1$ is less than $V_2$ if $V_{WELL}$ is less than 1.5 $V_{CC}$.

If $V_1$ is greater than $V_2$ then the voltage level on the output node 41 is low and if $V_1$ is less than $V_2$ then the voltage level on the output node 41 is high. The voltage level on $\phi_{WPE}$ terminal 47 is the same as the voltage level on the output node 41. Accordingly, the well regulator circuit 18 clocks $\phi_{WPE}$ high when $V_{WELL}$ is less than 1.5 $V_{CC}$ and clocks $\phi_{WPE}$ low when $V_{WELL}$ is greater than 1.5 $V_{CC}$.

Figure 5A:
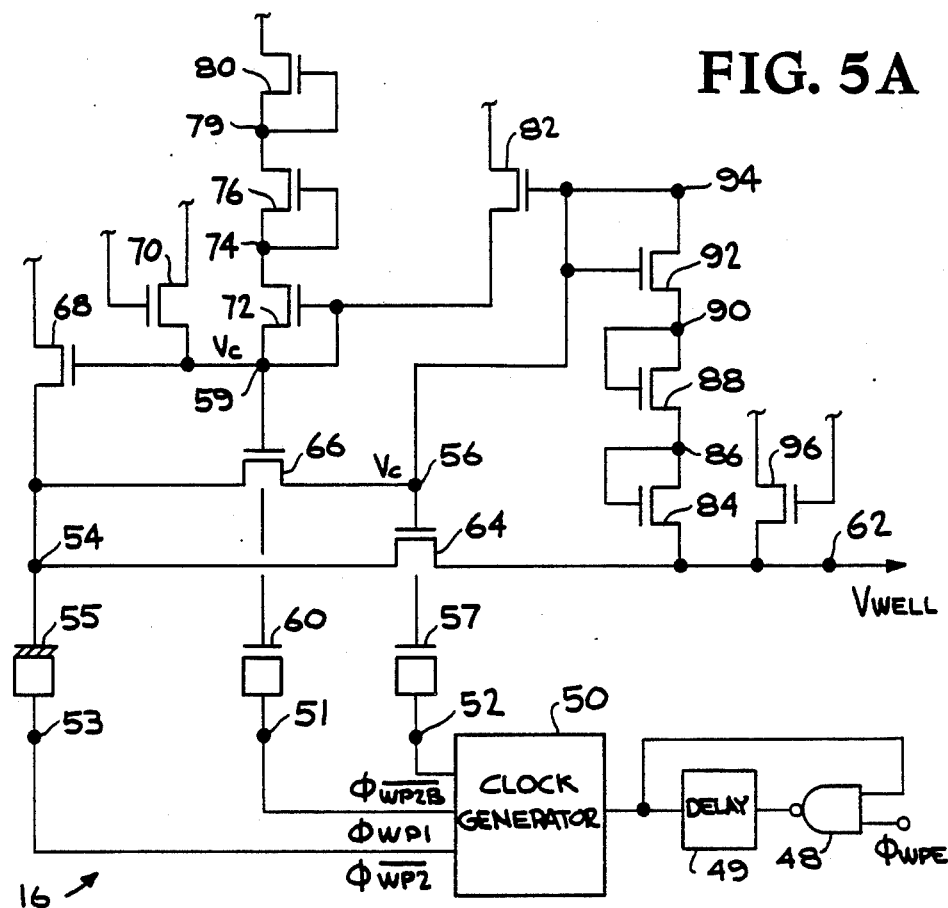
FIG. 5A is a circuit diagram of a charge pump.
Figure 5B:
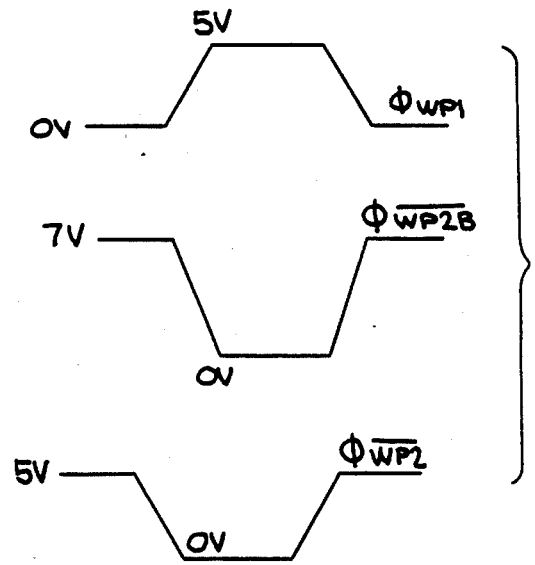
FIG. 5B is a timing diagram of the clock signals utilized in the circuit of FIG. 5A.

A circuit diagram of the charge pump 16 is depicted in FIGS. 5A and 5B. FIG. 5C is a phase diagram of the clock signals utilizing the circuit pump. Referring now to FIG. 5A, a NAND gate 48 has a first input coupled to the $\phi_{WPE}$ terminal 47. The output of the NAND gate 48 is coupled to the input of the delay 49 with the output of the delay 49 coupled to a second input of NAND gate 48. The output of the delay 49 is coupled to the input of a clock generator 50. Clock generator 50 provides clock outputs $\phi_{WP1}$, $\phi_{\overline{WP2B}}$ and $\phi_{\overline{WP2}}$ at clock outputs 51, 52, 53, respectively.

Clock generator output 53 is coupled to a first circuit node 54 by depletion device 55, clock generator output terminal 52 is coupled to a second circuit node 56 via capacitor 57, and clock generator terminal 51 is coupled to a third circuit node 58 by capacitor 60. The voltage level on the first circuit node 54 is designated $V_A$, on the second circuit node 56 $V_B$, and on the third circuit node 58 $V_C$.

The first circuit node 54 is coupled to a $V_{WELL}$ output terminal 62 by NMOS transistor 64. The first terminal 54 is coupled to the second terminal 56 by NMOS transistor 66. The first circuit node 54 is coupled to $V_{CC}$ by NMOS transistor 68. The gates of transistors 66 and 68 are coupled to the third circuit node 58. The gate of transistor 64 is coupled to the second circuit node 56.

NMOS transistor 70 has one terminal coupled to the third node 58, a second terminal coupled to $V_{CC}$, and its gate coupled to $V_{CC}$. Transistor 72 has a first terminal coupled to the third node 58 and a second terminal coupled to node 74. Node 74 is coupled to the first terminal of transistor 76 and to the gate of transistor 76. A second terminal of transistor 76 is coupled to circuit node 78. Circuit node 78 is coupled to a first terminal of transistor 80 and to the gate of transistor 80. The second terminal of transistor 80 is coupled to $V_{CC}$. The gate of transistor 72 is coupled to the third node 58 and to $V_{CC}$ by NMOS transistor 82.

NMOS Transistor 84 has one terminal coupled to the $V_{WELL}$ terminal 62 and a second terminal coupled to circuit node 86 and has its gate also coupled to circuit node 86. NMOS transistor 88 has a first terminal coupled to node 86, a second terminal coupled to node 90 and has its gate also being coupled to node 90. NMOS transistor 92 has a first terminal connected to node 90, a second terminal connected to node 94. Node 94 is coupled to the gates of transistors 82 and 92 and also to the second circuit node 56. The $V_{WELL}$ terminal 62 is coupled to $V_{CC}$ by NMOS transistor 96. The gate of transistor 96 is also coupled to $V_{CC}$.

FIG. 5B is a timing diagram of the output signals from the clock generator 50. The operation of the charge pump will now be described with reference to FIG. 5B. During time period I the first circuit node 54 is coupled to the $V_{WELL}$ output terminal 62 because $\phi\overline{WP2B}$ is high and transistor 64 is conducting. The first circuit node is isolated from the $V_{CC}$ terminal because $\phi_{WP1}$ is low and transistor 68 is not conducting.

During time period II the first circuit node 54 is isolated from the $V_{WELL}$ terminal 62 because $\phi\overline{WP2B}$ is clocked low and transistor 64 is off. The voltage level $V_C$, on the third node 58, is clocked from the low state to the high state by $\phi_{WP1}$. Accordingly, transistors 66 and 68 are switched on and the first and second nodes 54 and 56 are charged to $V_{CC}$.

During time period III, $\phi_{WP1}$ is clocked low to switch off transistors 66 and 68 and isolate the first and second circuit nodes 54 and 56 from $V_{CC}$. $\phi\overline{WP2}$ is clocked high and, because $V_A$ has been precharged to $V_{CC}$ during time period II, $V_A$ is boosted to about 10 volts. Additionally, $\phi\overline{WP2B}$ is also clocked high and the voltage level $V_B$ is boosted to about 10 volts. Because the second node is high, transistor 64 is switched on and the first node is coupled to the $V_{WELL}$ terminal 62. The excess charge pumped into the first circuit node 54 by the $\phi\overline{WP2}$ signal is transferred to the well to increase $V_{WELL}$. This pumping continues until $\phi_{WPE}$ is clocked low by the well detector. Accordingly, the charge pump increases $V_{WELL}$ to 1.5 $V_{CC}$.

Figure 6:
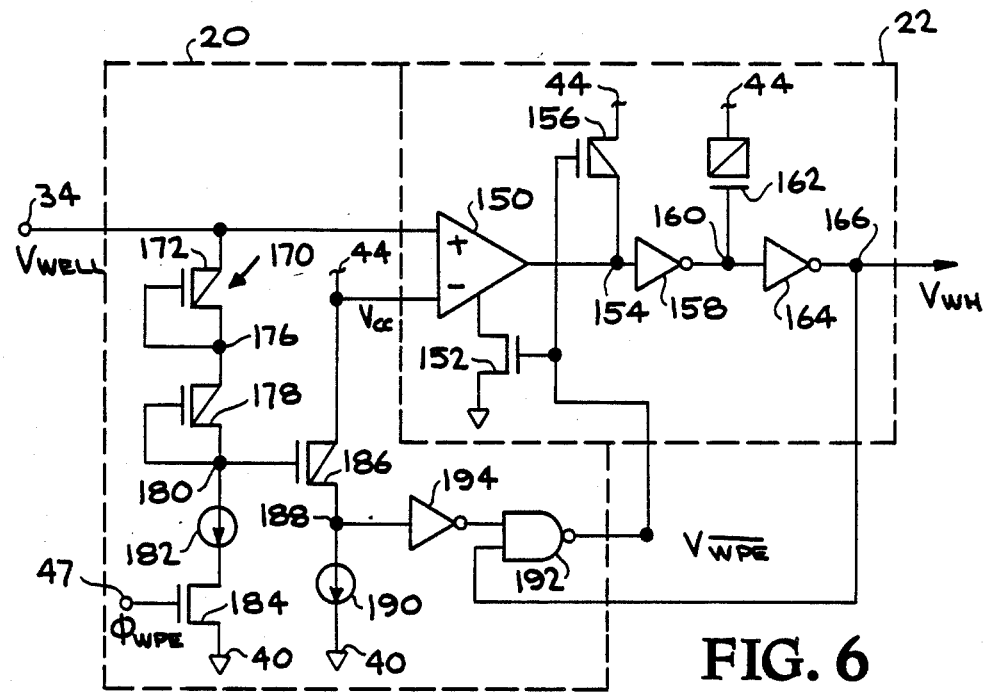
FIG. 6 is a schematic diagram of the well detector and well detector enabling circuits.

FIG. 6 is a circuit diagram depicting circuitry for the well detector 22 and the well detector enabling circuit 20. The well detector 22 includes a CMOS differential amplifier 50 having its inverting input coupled to $V_{CC}$ terminal 40 and its non-inverting input coupled to $V_W$ terminal 34. The differential amplifier 150 is coupled to the ground terminal 40 of the power supply via NMOS disabling transistor 152. The gate of the disabling transistor 152 receives the $\phi\overline{WDE}$ signal. The output of the differential amplifier 150 is coupled to a holding node 154. A PMOS holding transistor 156 has its source terminal coupled to $V_{CC}$ terminal 44, its gate coupled to $\phi\overline{WDE}$, and its drain terminal coupled to a holding node 154. Inverter 158 has its input coupled to holding node 154 and its output coupled to circuit node 160. Circuit node 160 is coupled to the $V_{CC}$ terminal 44 by capacitor 162. Inverter 164 has its input coupled to circuit node 160 and its output coupled to a well detector output terminal 166.

The well detector enabling circuit 20 includes a detection circuit 170, including a first PMOS detection transistor 172, having its source terminal coupled to the $V_W$ terminal 34, its drain terminal coupled to a circuit node 176, and its gate coupled to circuit node 176. Second detection transistor 178 has its source terminal coupled to node 176, its drain terminal coupled to circuit node 180, and its gate coupled to circuit node 180. Circuit node 180 is coupled to a CMOS current source 182. The current source 182 is coupled to the ground terminal 40 by NMOS transistor 184. NMOS transistor 184 has its gate coupled to the $\phi\overline{WPE}$ signal.

A PMOS output transistor 186 has its source terminal connected to the $V_{CC}$ terminal 44, its drain terminal coupled to an output node 188, and its gate coupled to circuit node 180. The output node 188 is coupled to the ground terminal 40 by a CMOS current source 190.

Output terminal 188 is coupled to a first input of a well detector NAND gate 192 via inverter 194. The second input of the NAND gate 192 is coupled to the output terminal 166 of the well detector 22. The output of NAND gate 192 is coupled to the gate of the disabling transistor 152 and provides the $\phi\overline{WDE}$ signal.

The detection circuit 170 is activated when $\phi_{WDE}$ is clocked high and NMOS transistor 184 conducts. Circuit node 180 is pulled low, thereby creating a negative potential at the gate of the second detection transistor 178. The second detection transistor 178 is connected in the diode configuration, i.e., the gate is coupled to the drain. When $V_{GS}$ of transistor 178 is equal to $-V_T$, transistor 178 conducts and pulls node 176 low. Similarly, when node 176 is pulled low the first detection transistor 172 begins to conduct. Because both the detection transistors 172 and 178 are coupled in the diode configuration the voltage level at node 176 is equal to $V_W-V_T$ and the voltage level at node 180 is equal to $V_W-2V_T$. Because the gate of the output transistor 186 is coupled to node 180, $V_G$ of transistor 186 is equal to $V_W-2V_T$. Thus, output transistor 186 conducts when $V_{GS}$ is equal to $-V_T$ or when $V_W$ is less than or equal to $V_{CC}+V_T$. When the output transistor 186 conducts output node 188 is charged to $V_{CC}$.

In summary, with $\phi_{WPE}$ clocked high, the voltage level at the output node 188 is low when $V_W$ is greater than $V_{CC}+V_T$ and is high when $V_W$ is less than $V_{CC}+V_T$. Table 2 is a truth table for the well detector enable NAND gate 192, where $V_0$ is the voltage level at the output node 188.

TABLE 2

| $V_{WH}$ | $V_0$ | $\phi\overline{WDE}$ |
|---|---|---|
| L | H | H |
| L | L | H |
| H | H | H |
| H | L | L |

From Table 2 it is apparent that $V_{WH}$ acts as a gate control signal for the well detector enable NAND gate 192. When $V_{WH}$ is low, i.e., when the array is forced into precharge, $\phi\overline{WDE}$ is always high and the well detector 22 is always enabled. However, when $V_{WH}$ is high, i.e., the array is released, the state $\phi\overline{WDE}$ is the same as the state of $V_0$.

Figure 3:
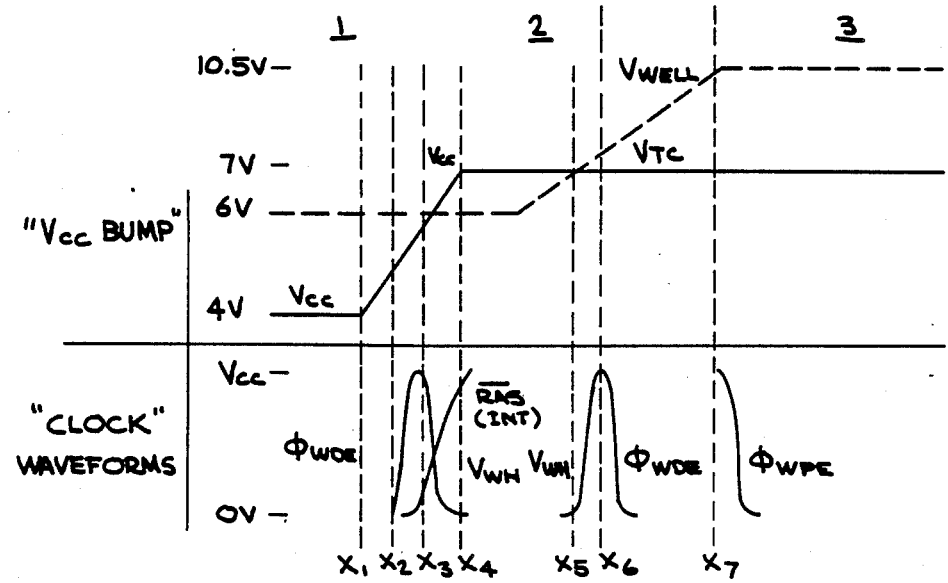
FIG. 3 is a timing diagram indicating the state of the various control signals and voltage levels during a power supply excursion.

The voltage state of the $\phi\overline{WDE}$ signal be analyzed for the case of a voltage bump as illustrated in FIG. 3. At time $X_1$, $V_{WH}$ is high and $V_0$ is low because $V_W$ is greater than $V_{CC}+V_T$. Accordingly, from Table 1, $\phi\overline{WDE}$ is low, the disabling transistor 152 is off, and the differential amplifier 150 is disabled. Thus, when the N-well is properly biased with respect to $V_{CC}$, the differential amplifier 150 is disabled to conserve power.

At time $X_2$, $V_W$ is less than 1.5 $V_{CC}$, and $\phi_{WPE}$ is clocked high by the well regulator. Accordingly, the detection circuit 170 of the well detector enable circuit 20 is activated by transistor 184. The signal $V_0$ is clocked high because $V_W$ is less than $V_{CC}+V_T$ and the output transistor 186 conducts to charge the output node 188. $V_{WH}$ is still high because node 154 is coupled to node $V_{CC}$ by the PMOS transistor 156. Thus, from the Table 2, with $V_0$ high and $V_{WH}$ high, $\phi\overline{WDE}$ is clocked high and the disabling transistor 152 conducts to enable the difference amplifier 150. Additionally, when $\phi\overline{WDE}$ is clocked high, the holding transistor 156 is deactivated to decouple the holding node 154 from the $V_{CC}$ terminal. The output of the difference amplifier 150 is high because $V_W$ is greater than $V_{CC}$ at time $X_2$. Accordingly, $V_{WH}$ remains high.

At time $X_3$ the output of the differential amplifier 150 goes low because $V_W$ is less than $V_{CC}$. Accordingly, $V_{WH}$ is clocked low and $\overline{RAS}$ (INT) is held high to force the array into the precharge state. From Table 2, $\phi\overline{WDE}$ remains high and the differential amplifier 150 remains enabled.

During the period from $X_4$ to $X_5$, $V_W$ is less than $V_{CC}$, so that the output of the difference amplifier 150 is low and $V_{WH}$ remains low. Additionally, $V_0$ is high because $V_W$ is less than $V_{CC}+V_T$. From Table 2, $\phi_{WDE}$ remains high and the differential amplifier 150 continues to be enabled and hold $V_{WH}$ low.

Between $X_5$ and $X_6$, $V_W$ is greater than $V_{CC}$ but less than $V_{CC}+V_T$. $V_{WH}$ is clocked high by the difference amplifier 150 because $V_W$ is greater than $V_{CC}$. $V_0$ still remains low because $V_W$ is less than $V_{CC}+V_T$. Accordingly, $V\overline{WDE}$ is still high and the differential amplifier 150 remains enabled during this short time period to charge the holding capacitor 162 to hold $V_{WH}$ high during the transition period when the difference amplifier 150 is disabled.

At time $X_6$, $V_W$ is greater than $V_{CC}+V_T$, the output transistor 186 is deactivated, and the output node 188 is discharged via the current source 190. Accordingly, $V_0$ goes low. From Table 2, with $V_0$ low and $V_{WH}$ high, $\phi\overline{WDE}$ is clocked low to turn off the disabling transistor 152 and disable the differential amplifier 150. The $V_{WH}$ signal is held high by capacitor 162 while the $\phi\overline{WDE}$ signal activates holding transistor 156 to charge the holding node 154 high and hold $V_{WH}$ at the high voltage level.

Figure 7:
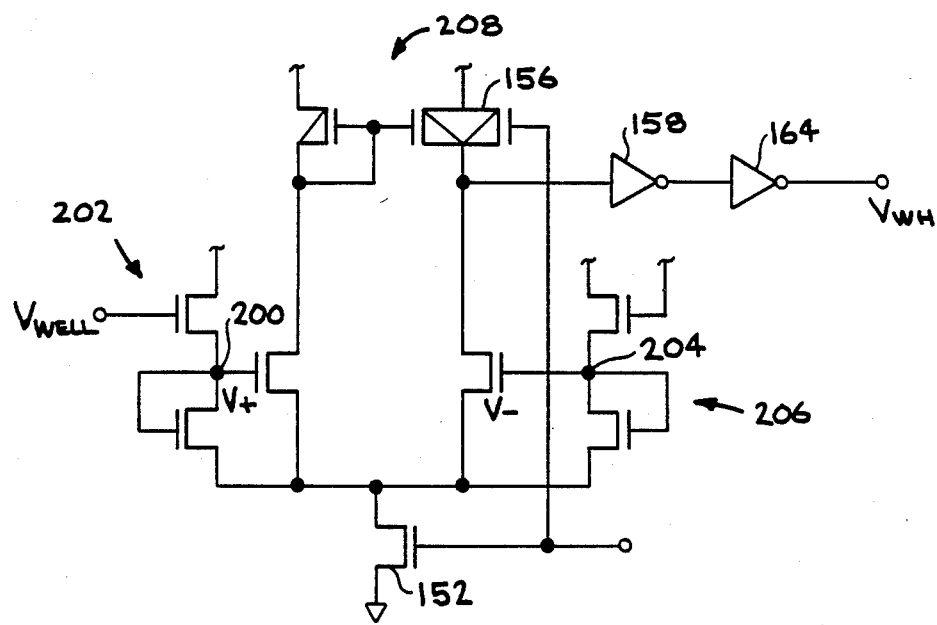
FIG. 7 is a circuit diagram of the well detector.

FIG. 7 is a circuit diagram of CMOS differential amplifier 150. In FIG. 7, the + input is + node 200 of input circuit 202. The − input is − node 204 of reference circuit 206.

A CMOS comparator 208 provides a high output at output node 154 when $V_+ > V_-$ and a low output when $V_+ < V_-$.

The voltage level at − node 204 is set at $V_{CC}/2$ by reference circuit 206 The voltage level at + node 200 is set at $V_{WELL}/2$, by input circuit 202.

Accordingly voltage level, $V_{WH}$, at output node 154 is high when $V_W > V_{CC}$ and low when $V_W < V_{CC}$.

The present invention thus prevents forward biasing of junctions between the bit lines and transfer gates and N-well to prevent charge injection or bipolar latchup during the active cycle of the memory. The well detector enabling circuit reduces power dissipation by disabling the well detector when it is not needed.

The invention has been explained with reference to specific embodiments. Other embodiments will now be apparent to those of ordinary skill in the art. In particular, the invention may be utilized in a memory array having NMOS bit line connections and transfer gates disposed in a P-type well. Additionally, other gating configurations than those described above may be utilized to attain the equivalent logical functions described herein. Further, the states of the various signals set forth above may be varied by utilizing inverters. The techniques described for controlling the states of the well pump enabling signal, well detector enabling signal, and gate control signals may be utilized in other technologies, such as NMOS, PMOS, or bipolar. Accordingly, it is therefore not intend that the invention be limited except as indicated by the appended claims.

What is claimed is:

1. In a CMOS memory array of the type having memory cells and bit line terminals of a first conductivity type disposed in a well of a second conductivity type and having a control input, where the well is biased at voltage level $V_W$, where the memory array is in a precharge cycle when a control signal at the control input is in a first control voltage state, where the memory is in an active cycle when the control signal at the control input is in a second control voltage state, and where the memory array is coupled to a voltage supply having $V_{CC}$ and ground terminals, a system for biasing $V_W$ so that the bit line junctions and memory cell junction, formed between the well and the bit line terminals and memory cells, respectively, are reverse biased and for gating an external control signal to the control input to prevent forward biasing of the bit line or memory cell junctions during powerup or a $V_{CC}$ bump, said system comprising:

a gating circuit, having an output terminal coupled to the control input of the array, a first input for receiving a gate control signal, and a second input for receiving the external control signal, said gating circuit for setting the voltage state at the gate output terminal equal to the first control voltage state when the state of the gate control signal is equal to a first gating voltage state and for setting the voltage state at the gate output terminal equal to the state of the external control signal when the state of the gate control signal is equal to a second gating voltage state; and detection means for switching the gate control signal from the second gating voltage state to the first gating voltage state when the difference between $V_{CC}$ and $V_W$ is a selected first polarity state.

2. The invention of claim 1 further comprising: means for disabling said detection means subsequent to the time when the difference between $V_{CC}$ and $V_W$ switches from the first polarity state to a second polarity state where power dissipation is reduced when said detection means are disabled.

3. The invention of claim 2 further comprising: means for maintaining the magnitude of $V_W$ equal to $MV_{CC}$ where M is a desired scaling factor.

4. The invention of claim 1 having PMOS memory cells and bit line terminal disposed in an N-type well.

5. The invention of claim 3 wherein said means for maintaining further comprises:

a charge pump that increases $V_W$ when enabled; and
   means for enabling said charge pump when $V_W$ is less than $MV_{CC}$.

6. The invention of claim 5 wherein $MV_{CC}$ is about equal to 1.5 $V_{CC}$.

7. The invention of claim 6 wherein said disabling means disables said detection means when $V_W$ is greater than or equal to $V_{CC}+V_T$.

8. In a CMOS memory array of the type having PMOS memory cells and bit line terminals disposed in an N-well formed in a P-type substrate and having a control input, where the N-well is biased at voltage level $V_W$, where the memory array is in a precharge cycle when a control signal at the control input is in a first control voltage state, where the memory is in an active cycle when the control signal at the control input is at a second control voltage state, and where the memory array is coupled to a voltage supply having $V_{CC}$ and ground terminals, a system for biasing $V_W$ so that the bit line junctions and memory cell junction, formed between the well and the bit line terminals and memory cells, respectively, are reverse biased and for gating an external control signal to the control input to prevent forward biasing of the bit line or memory cell junctions during powerup or a $V_{CC}$ bump, said system comprising:

a NAND gate for receiving a gate control signal, $V_{WH}$, at a first input, for receiving said external control signal, $\overline{RAS}$, at a second inverting input, and for providing an internal control signal, $\overline{RAS}$ internal (INT) at its output, with the output of said NAND gate coupled to the control input of said memory array; and a differential amplifier, for receiving said well bias voltage, $V_W$, at its non-inverting input, for receiving the $V_{CC}$ voltage at its inverting input, and for providing said gate control signa , $V_{WH}$, at its output with the output of said differential amplifier coupled to the first input of said NAND gate.

9. The invention of claim 8 further comprising:
a well detector enable circuit for clocking a well detector enable signal, $\phi\overline{WDE}$, low when $V_W$ is greater than or equal to $V_{CC}+V_T$;
a PMOS holding transistor having its source coupled to said $V_{CC}$ terminal, its gate adapted for receiving said $\phi_{WDE}$ signal, and its drain coupled to a holding node where the sign $V_{WH}$ is equal to the voltage level on said holding node, said PMOS holding transistor for holding $V_{WH}$ high when $\phi\overline{WDE}$ is in the low voltage state; and
an NMOS disabling transistor coupling said differential amplifier to said ground terminal with the gate of said NMOS holding transistor adapted to receive said $\phi\overline{WDE}$ signal with said NMOS disabling transistor for decoupling said differential amplifier from said external power supply when $\phi\overline{WDE}$ is clocked low.

10. The invention of claim 9 wherein said well detector enable circuit comprises:
first and second PMOS biasing transistors coupling said well to a biasing node, with said first and second biasing transistors connected in the diode configuration;
an output transistor coupling the $V_{CC}$ terminal to an output node with the gate of the output transistor coupled to said biasing node, and with the voltage developed on said output node equal to $V_0$;
a well detector enable NAND gate having a first input for receiving the inverted $V_0$ signal, having a second terminal for receiving said well detector output signal, $V_{WH}$, and having an output terminal for providing said well detector enable signal, $\phi\overline{WDE}$, where the state of said $\phi\overline{WDE}$ signal is equal to the state of $V_0$ when $V_{WH}$ is high and where $\phi\overline{WDE}$ is held high when the state of $V_{WH}$ is low.

11. The invention of claim 10 further comprising:
a well regulator for clocking a well pump enable signal, $\phi_{WPE}$, high when $V_W$ is less than $V_{REF}$; and
a well pump for increasing the magnitude of $V_W$ when $\phi_{WPE}$ is clocked high.

* * * * *